(12) United States Patent
Yanagida et al.

(10) Patent No.: US 9,320,146 B2
(45) Date of Patent: Apr. 19, 2016

(54) ELECTRONIC CIRCUIT MODULE COMPONENT

(71) Applicant: TDK CORPORATION, Tokyo (JP)

(72) Inventors: Miyuki Yanagida, Tokyo (JP); Hisayuki Abe, Tokyo (JP)

(73) Assignee: TDK CORPORATION, Tokyo (JP)

( * ) Notice: Subject to any disclaimer, the term of this patent is extended or adjusted under 35 U.S.C. 154(b) by 207 days.

(21) Appl. No.: 13/958,887

(22) Filed: Aug. 5, 2013

(65) Prior Publication Data

US 2014/0041913 A1 Feb. 13, 2014

(30) Foreign Application Priority Data

Aug. 9, 2012 (JP) ................. 2012-176675

(51) Int. Cl.
*H01G 4/228* (2006.01)
*H05K 1/18* (2006.01)
*H05K 3/34* (2006.01)
*H01G 4/30* (2006.01)
*H01G 2/06* (2006.01)
*H01G 4/232* (2006.01)

(52) U.S. Cl.
CPC ................. *H05K 1/18* (2013.01); *H01G 2/065* (2013.01); *H01G 4/232* (2013.01); *H01G 4/30* (2013.01); *H05K 3/3442* (2013.01); *H05K 2201/10636* (2013.01); *Y02P 70/611* (2015.11); *Y02P 70/613* (2015.11)

(58) Field of Classification Search
USPC ........................................... 361/306.1, 306.3
See application file for complete search history.

(56) References Cited

U.S. PATENT DOCUMENTS

| | | | | |
|---|---|---|---|---|
| 5,569,880 A | * | 10/1996 | Galvagni et al. | 174/527 |
| 5,742,473 A | * | 4/1998 | Sano | C04B 35/468 |
| | | | | 361/303 |
| 2010/0038120 A1 | | 2/2010 | Kojima et al. | |
| 2013/0279071 A1 | * | 10/2013 | Okamoto | H01G 4/30 |
| | | | | 361/301.4 |

FOREIGN PATENT DOCUMENTS

| | | | | |
|---|---|---|---|---|
| JP | 05062003 | U | * | 8/1993 |
| JP | 05243074 | A | * | 9/1993 |
| JP | 07066074 | | * | 3/1995 |
| JP | 10270288 | A | * | 10/1998 |
| JP | A-2004-186502 | | | 7/2004 |
| JP | 2007281134 | A | * | 10/2007 |
| JP | A-2010-045209 | | | 2/2010 |
| JP | 2012054411 | | * | 3/2012 |

* cited by examiner

*Primary Examiner* — Eric Thomas
(74) *Attorney, Agent, or Firm* — Oliff PLC

(57) ABSTRACT

One aspect of an electronic circuit module component is an electronic circuit module component formed by joining a board and an electronic component comprising an element body having a mounting surface and a plurality of side faces to each other with solder; the electronic component comprising a first terminal electrode formed on the mounting surface and one of the plurality of side faces, a second terminal electrode formed on the mounting surface and another side face in the plurality of side faces, and an oxide film covering at least a part of surfaces of side face parts of the first and second terminal electrodes formed on the side faces; wherein mounting parts of the first and second terminal electrodes formed on the mounting surface are joined to the board with the solder.

9 Claims, 7 Drawing Sheets

ELECTRONIC CIRCUIT MODULE COMPONENT

BACKGROUND OF THE INVENTION

1. Field of the Invention

The present invention relates to an electronic circuit module component equipped with an electronic component.

2. Related Background Art

It has been required for electronic components to become further smaller in size as electronic devices to be mounted therewith have been attaining higher performances and smaller sizes. When mounting such an electronic component to a board of an electronic instrument, a terminal electrode of an electronic circuit module component and a pad on the board of the electronic instrument are joined to each other with solder. That is, the electronic circuit module component herein is constituted by a plurality of electronic components mounted to a board with solder so as to have a group of functions. The electronic components made smaller in size have further been demanded to be mounted to printed wiring boards and the like at higher density with solder in a reflow step (a step of placing the electronic components on a board coated beforehand with a solder paste and collectively performing soldering in a continuous furnace), so as to be used as electronic circuit modules in electronic devices and the like.

FIG. 1 is a schematic view of a cross section of an electronic circuit module in which a typical electronic component is mounted on a printed wiring board 10. In this electronic component 1, inner electrode layers 3 are stacked alternately with ceramic layers 4 within an element main body 2 (hereinafter referred to as element body 2). Foundation electrode layers 5 of terminal electrodes 7 are formed so as to cover surfaces of the element body 2 where the inner electrode layers 3 are exposed. The foundation electrode layer 5 has an outer surface formed with a Ni plating layer 6a which, together with a Sn plating layer 6b formed thereon, constitutes a two-layered plating layer 6.

Further, the electronic component 1 is joined through solder 8 to pads 9 on the printed wiring board 10. Heat treatment in the reflow step causes the solder 8 to run the Sn plating layers 6b and wet the surfaces of the plating layers 6, so as to form an intermetallic compound with the Sn plating layers 6b, thereby joining with the pads 9 on the board, thus forming the electronic circuit module component. Examples of such electronic circuit module components have been proposed in Patent Literature 1 (Japanese Patent Application Laid-Open No. 2004-186502) and the like.

On the other hand, as terminal electrodes of electronic components, those of LGA (Land Grid Array) type may be employed in order to be mounted on printed wiring boards and the like at high density with solder. FIG. 2 is a schematic view of a cross section of a typical electronic component employing the LGA for its terminal electrodes.

The electronic component 11 illustrated in FIG. 2 has a plurality of patterns of ceramic layers 13 and inner electrode layers 12 stacked alternately with each other with the inner electrode layers 12 shifting alternately to one side or the other and connecting with their corresponding through-hole electrodes 14 penetrating therethrough in the stacking direction at the shifted parts. Outer connection electrodes 15 are formed as terminal electrodes at respective end parts of the through-hole electrodes 14 and arranged so as to be connectable to a board or the like on one surface of the electronic component 11. Examples of such electronic component 11 equipped with LGA type terminal electrodes have been proposed in Patent Literature 2 (Japanese Patent Application Laid-Open No. 2010-045209) and the like.

In the electronic component 1, however, the terminal electrodes 7 are formed on the lower face of the element body 2 (the surface opposing the printed wiring board 10; hereinafter referred to as mounting surface) and side faces of the element body 2 adjacent to the mounting surface. At the time of soldering, the solder wets not only the surfaces of the mounting parts of the terminal electrodes 7 formed on the mounting surface of the element body 2, but also surfaces of the side faces which abut the surfaces of the mounting parts of the terminal electrodes 7, which makes it difficult for the mounting area to become smaller on the printed wiring board 10. In the case of an electronic circuit module component mounted on a board such that electronic components have a very small distance therebetween, the gap between the side face parts of the terminal electrodes of the electronic components may be so narrow that unnecessary substances such as dust entering there is likely to induce a problem such as a short circuit therethrough, which puts a limit to increasing the density of electronic components in the electronic circuit module component.

In the electronic component 11, on the other hand, terminal electrode parts can be formed as the outer connection electrodes 15 on the lower face alone, which makes it easier to reduce the mounting area. However, it necessitates complicated steps of making through-holes, filling the through-holes with conductive pastes, and so forth at the time of forming the electronic component 11, which makes it hard to further thin the ceramic layers 13 and inner electrode layers 12 or increase the number thereof. The existence of the through-hole electrodes 14 makes the effective electrode area smaller than that of the conventional electronic component 1, thereby making it harder to produce an electronic component having a large capacity. Hence, there has been a limit to reducing the mounting area, which has been advancing together with demands for making these electronic components smaller, whereby it has been required to reduce the mounting area without lowering the capacity of the electronic component.

SUMMARY OF THE INVENTION

In view of the foregoing circumstances, it is an object of the present invention to provide an electronic circuit module component which can be mounted at high density.

In one aspect, the present invention provides an electronic circuit module component formed by joining a board and an electronic component comprising an element body having a mounting surface and a plurality of side faces to each other with solder; the electronic component comprising a first terminal electrode formed on the mounting surface and one of the plurality of side faces, a second terminal electrode formed on the mounting surface and another side face in the plurality of side faces, and an oxide film covering at least a part of a surface of a side face parts of each of the first and second terminal electrodes formed on the side faces; wherein a mounting part of each of the first and second terminal electrodes formed on the mounting surface is joined to the board with the solder.

This can yield an electronic circuit module component equipped with a joint having high mounting reliability between the terminal electrode of the electronic component and the board, which can maintain characteristics without short circuits even when the mounting density is raised.

Preferably, $L1 < L2$, where $L1$ is the thickness from the surface of the oxide film to a boundary between the surface of the side face part of the terminal electrode and the oxide film, and L2 is the distance from the surface of the oxide film to a boundary between the solder and the oxide film as seen as a thickness in a direction perpendicular to the mounting surface.

This can reduce the area of the joint between the terminal electrode of the electronic component and the board, thereby further decreasing the mounting area.

The present invention can yield an electronic circuit module component which can be mounted at high density.

DESCRIPTION OF THE PREFERRED EMBODIMENTS

Figure 1:
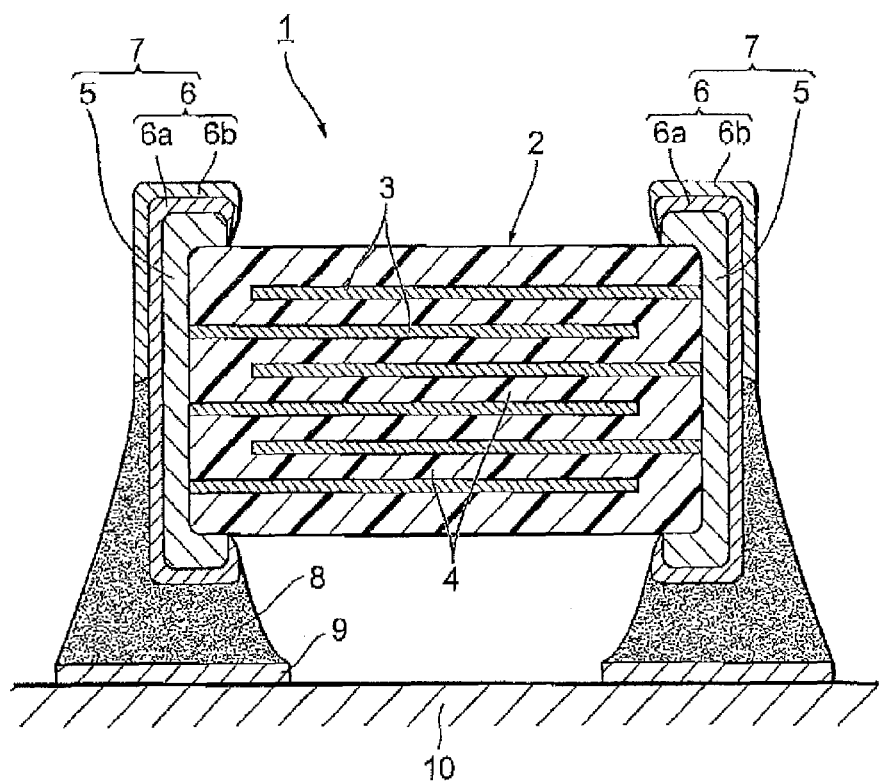
FIG. 1 is a sectional view schematically illustrating a mode of mounting a conventional electronic component.
Figure 2:
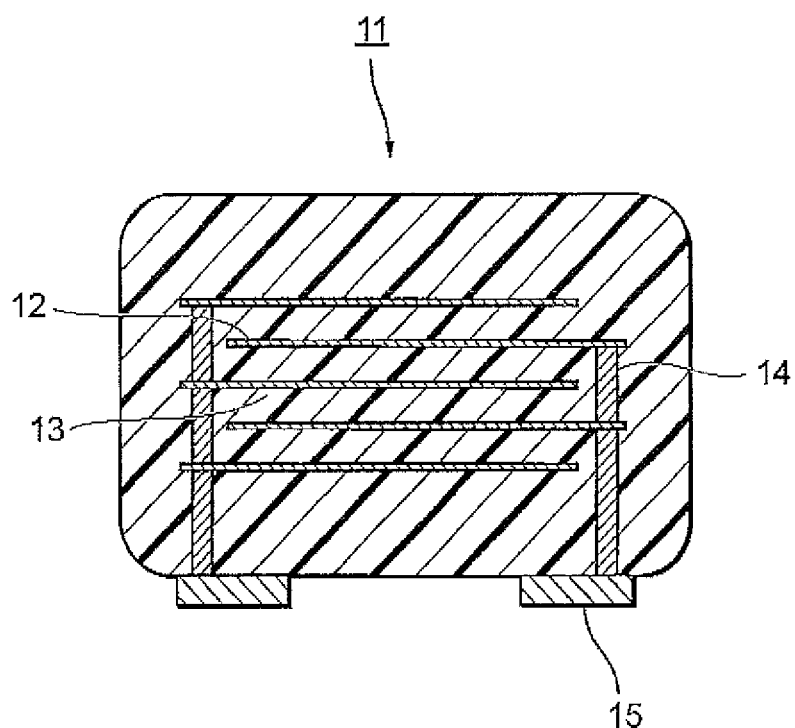
FIG. 2 is a sectional view schematically illustrating a conventional through-hole type electronic component.

The electronic circuit module component in accordance with any of embodiments in accordance with the present invention is one having a group of functions by mounting a plurality of electronic components to a printed wiring board. Here, the electronic components may be mounted either on or within the printed wiring board. Examples of the electronic components, which are not restricted in particular, include capacitors, piezoelectric elements, inductors, varistors, thermistors, resistors, transistors, diodes, crystal oscillators, their composite elements, and other surface-mounting electronic components.

In the following, preferred embodiments of the present invention will be explained with reference to the drawings when necessary. In the drawings, the same or equivalent constituents will be referred to with the same signs while omitting their overlapping descriptions. Positional relationships such as upper, lower, left, and right will be based on those in the drawings unless otherwise noted.

Figure 3:
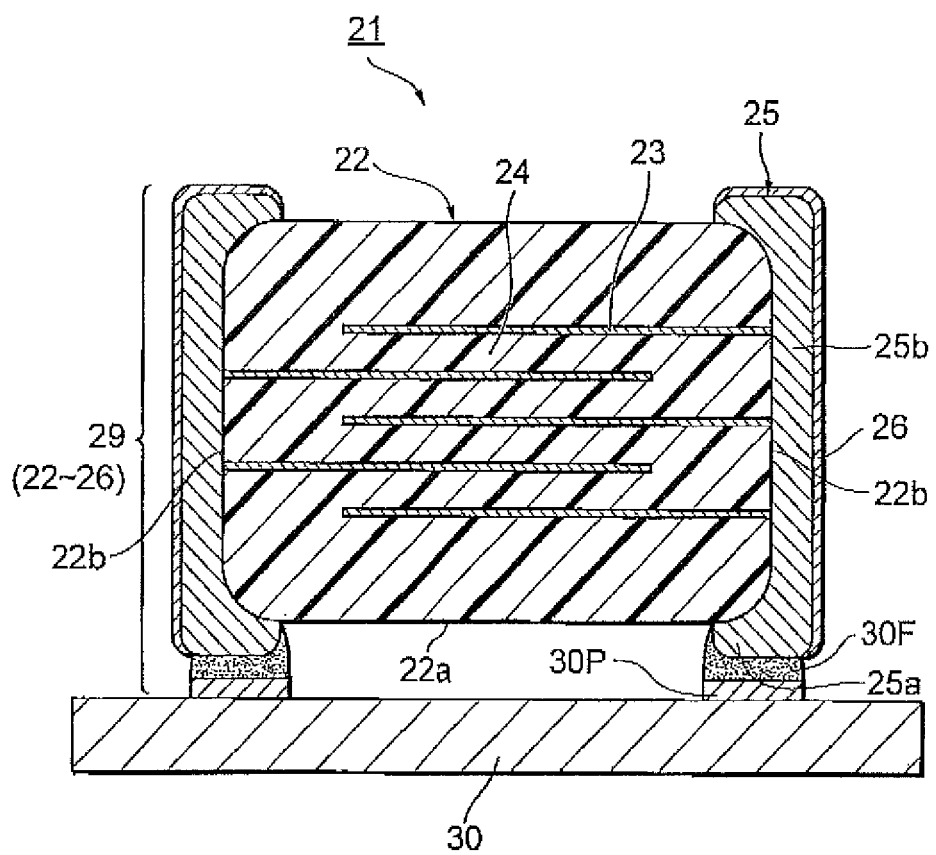
FIG. 3 is a sectional view schematically illustrating an electronic circuit module component of Embodiment 1.

Embodiment 1 in accordance with the present invention explains an electronic circuit module component 21 illustrated in FIG. 3 by way of example. In the electronic circuit module component 21, an electronic component 29 is joined to a board 30, while the electronic component 29 comprises an element body 22 in which ceramic layers 24 are alternately stacked with inner electrode layers 23. The element body 22 has a mounting surface 22a, which is a surface opposing the board 30, and four side faces 22b, 22c. (Regarding 22c, refer to FIG. 5 described hereinafter) The inner electrode layers 23 are stacked such that their end parts are alternately exposed to a pair of opposing side faces 22b of the element body 22. Both end parts of the element body 22 including the pair of side faces 22b are formed with a pair of terminal electrodes 25 electrically connected to their corresponding inner electrode layers 23 arranged within the element body 22. The pair of terminal electrodes 25 are formed so as to cover both end parts of the element body 22 and connected to the exposed parts of the inner electrode layers 23, so as to constitute an electric circuit. That is, the electronic component 29 comprises a first terminal electrode 25 formed on the mounting surface of the element body 22 and one of a plurality of side faces (i.e., four side faces) and a second terminal electrode 25 formed on the mounting surface of the element body 2 and another side face in the plurality of side faces. When appropriate in the following explanation, in the terminal electrodes 25, the parts formed on the mounting surface 22a of the element body 22 will be referred to as mounting parts 25a, while parts formed on the side faces 22b, 22c of the element body 22 will be referred to as side face parts 25b. By the side faces of the terminal electrodes 25 are meant surfaces of side face parts located substantially perpendicularly to the mounting parts of the terminal electrodes 25.

The side faces of the terminal electrodes 25 formed on an element body having no inner electrode layers are the surfaces of the side face parts 25b extending substantially perpendicularly to the surface of the mounting part 25a of the terminal electrode 25, while other opposing surfaces also have side faces of another terminal electrode 25.

In the electronic component 29 in accordance with Embodiment 1, each terminal electrode 25 has a surface provided with an oxide film 26. More specifically, in the electronic component 29, the mounting part 25a of the terminal electrode 25 of the electronic component 29 is joined with solder 30F to a connection pad 30P on the board 30, while the remaining part is totally covered with the oxide film 26.

In the electronic component 29 in the electronic circuit module component 21 in accordance with Embodiment 1, the element body 22, whose outer shape and size can be set according to its use without being restricted in particular, may typically have a substantially rectangular parallelepiped outer shape with a size on the order of 0.2 to 5.6 mm (L)×0.1 to 5.0 mm (W)×0.1 to 1.9 mm (H). In particular, a small size of 0.4 mm or less (L)×0.2 mm or less (W)×0.2 mm or less (H) can also be effective in reducing inferior joints at the time of mounting to the board with solder and so forth.

The thickness of the terminal electrode 25 in accordance with Embodiment 1 may be determined as appropriate according to its use and the like and is preferably on the order of 1 to 50 µm in general.

From the viewpoint of inhibiting solder from going up at the time of mounting the electronic component 29 to the board 30 by soldering, it will be sufficient if the oxide films 26 are disposed at least on the surfaces of the side face parts 25b of the terminal electrodes 25 opposing each other longitudinally of the electronic component 29. This is because they inhibit solder from rising along the surfaces of the side face parts of the terminal electrodes 25 at the time of mounting by soldering and thus are effective in reducing the mounting area. The oxide films 26 cover the surfaces of the side face parts 25b of the terminal electrodes 25 and thus can inhibit the side face parts of the terminal electrodes 25 from coming into contact with each other and causing a short circuit even when the distance between the electronic components is very short.

From the viewpoint of inhibiting solder from going up at the time of mounting the electronic component 29 to the connection pad 30P on the board 30 by soldering, it will be sufficient if the oxide films 26 are disposed at least on the surfaces of the side face parts 25b of the terminal electrodes 25 excluding the mounting parts 25a thereof in the electronic component 29. Covering the surfaces of the side face parts 25b other than the mounting parts 25a with the oxide films 26 is also more preferred in that it is effective in restraining deterioration such as corrosion from occurring under environments where the terminal electrodes 25 are in use.

The joint surfaces between the terminal electrodes 25 and the connection pads 30P on the substrate 30 are disposed on a plane parallel to the inner electrode layers 23 in Embodiment 1, but are not restricted thereto as long as they are on the same plane of the electronic component 29 without being influenced by the arrangement of the inner electrode layers 23 of the element body 22.

By joining the terminal electrodes 25 to the connection pads 30P of the board 30 through the solder 30F, the electronic component 29 can yield the electronic circuit module component 21 having a small mounting area. Therefore, in order to make it easier to grasp the mounting surface when mounting the electronic component to the board 30, it is preferred for the electronic component 29 to have such a structure that its mounting surface is discernible. This may be done by providing the element body 22 with some marks or rendering the electronic component 29 an asymmetrical form.

The electronic component 29 is mounted onto the board 30 and joined to a printed wiring part on the board 30 through the solder 30F. Therefore, disposing the joints to join with the connection pads 30P of the board 30 on the same surface of a pair of terminal electrodes 25 formed on one surface of the electronic component 29 can reduce the mounting area of the electronic component 29 on the surface of the board 30, thereby raising the mounting density.

Though not restricted in particular, preferred typical examples of materials for the terminal electrodes 25 at this time include Ag, Cu, Ni, and those constituted by their alloys. Among them, preferably used are Cu and Ni, with which the inner electrode layers 23 can be constructed by base metals, and materials containing their alloys. In particular, they are preferably constituted by Cu or Ni from the viewpoint of connectivity and in that the oxide film 26 can be provided by oxidizing the surface of the terminal electrode 25.

Preferably, the oxide film 26 is formed by forced oxidation. Preferably, the oxide film 26 exhibits an oxide peak discriminable by X-ray diffractometry or the like and is insulative, and thus has a thickness of 10 nm or greater. The thickness is preferably 1 µm or less in order to keep the electric joint with the inner electrode layers 23.

Though metals contained in the oxide film 26 are not restricted in particular, the oxide film 26 preferably contains at least one metal selected from Cu, Fe, Zn, Al, and Ni or any of their alloys, for example. This can inhibit short circuits from occurring when the electronic component 29 comes into contact with other electronic components on the board 30. From the viewpoint of electrical junction with the inner electrode layers 23, metals containing Cu and Ni or alloys thereof are more preferred.

An alloy phase is formed between metals contained in the terminal electrode 25 and solder, whereby the solder wets the surface of the terminal electrode 25 and goes up the surface of the side face part 25b of the terminal electrode 25. Depending on the type of metal contained in the terminal electrode 25, however, the temperature and reaction speed at which it forms the alloy phase with the solder may vary. They vary greatly in particular between Sn and any of other types of metals, whereby the speed at which the solder goes up the surface of the side face part 25b of the terminal electrode 25 is much slower when the terminal electrode 25 does not contain Sn as a component for the side face part 25b than when does.

When an oxide of any of the other metals exists on the surface of the side face part 25b of the terminal electrode 25, solder is hard to go up the surface of the side face part 25b of the terminal electrode 25, whereby the electronic component 29 comprising the terminal electrode 25 with a small mounting area can be obtained, which makes it possible to yield the electronic circuit module component 21 mountable at high density.

When the oxide film 26 contains Sn, on the other hand, the speed at which it forms an alloy with solder is lower than that at which an alloy is formed between solder and metallic Sn or a Sn alloy, but the solder goes up the surface of the side face part 25b of the terminal electrode 25, thereby making it harder to obtain the electronic component 29 comprising a terminal electrode with a smaller mounting area.

In Embodiment 1 in accordance with the present invention, the joint between the electronic component 29 and board 30 in the electronic circuit module component 21 will be explained with reference to its enlarged view illustrated in FIG. 4. Preferably, in the electronic circuit module component 21, $L1 < L2$, where L1 is the thickness (of the oxide film 26) from the surface of the oxide film 26 to a boundary between the surface of the side face part 25b of the terminal electrode 25 and the oxide film 26, and L2 is the distance from the surface of the oxide film 26 to a boundary between the solder and the oxide film 26 as seen as a thickness in a direction perpendicular to the mounting surface (the surface of the board 30). The direction perpendicular to the mounting surface is the direction of arrow 400. As depicted, L1 and L2 can be measured from the cross section.

A method of manufacturing the electronic circuit module component 21 of Embodiment 1 comprises:

(i) a first step of forming, cutting, and firing a green multilayer body having a plurality of ceramic green sheets (ceramic layers 24) and electrode layers (inner electrode layers 23) buried between adjacent ceramic green sheets, so as to form the element body 22;

(ii) a second step of forming the first terminal electrode 25 on the mounting surface 22a and one side face 22b of a plurality of side faces 22b, 22c and the second terminal electrode 25 on the mounting surface 22a and another side face 22b of the plurality of side faces 22b, 22c, so as to make the terminal electrodes 25;

(iii) a third step of disposing the oxide films 26 on the surfaces of the side face parts 25b of the first and second terminal electrodes 25, which are parts formed on the side faces 22b, 22c; and (iv) a fourth step of joining the mounting parts 25a of the first and second terminal electrodes 25 to the board with solder. These steps will be explained in detail in the following.

The first step is a step for preparing the element body 22. Though not restricted in particular, barium titanate may be used as a main component in the element body 22, for example.

Next, the ceramic green sheets formed with desirable various electrode patterns are stacked in a predetermined order. Ceramic green sheets formed with no electrode patterns may be inserted in the stack as appropriate. Thus, the green multilayer body having a plurality of ceramic green sheets and electrode layers buried between adjacent ceramic green sheets can be obtained.

The green multilayer body is cut into a predetermined size, thus obtained green chip is debindered, fired, and annealed, and then surfaces where end parts of the inner electrode layers 23 are exposed (the side faces 22b, which will also be referred to as end faces of the element body 22 in the following) are polished by barrel polishing, sandblasting, or the like, whereby the element body 22 is obtained.

The second step is a step for forming a pair of terminal electrodes 25 on the end faces of the element body 22. The terminal electrodes 25 may be formed by baking applied electrodes or electrolytic or electroless plating, though the method of forming them is not restricted in particular. For example, terminal electrodes made of Cu may be formed as the terminal electrodes 25 on the end faces of the element body 22.

When forming them by baking applied electrodes, for example, a paste for outer electrodes is printed or applied and then fired, so as to form the terminal electrodes 25. The outer electrodes are fired, for example, for about 10 min to 1 hr at a temperature of 600 to 800° C. in a humidified mixed gas of $N_2$ and $H_2$.

Figure 5:
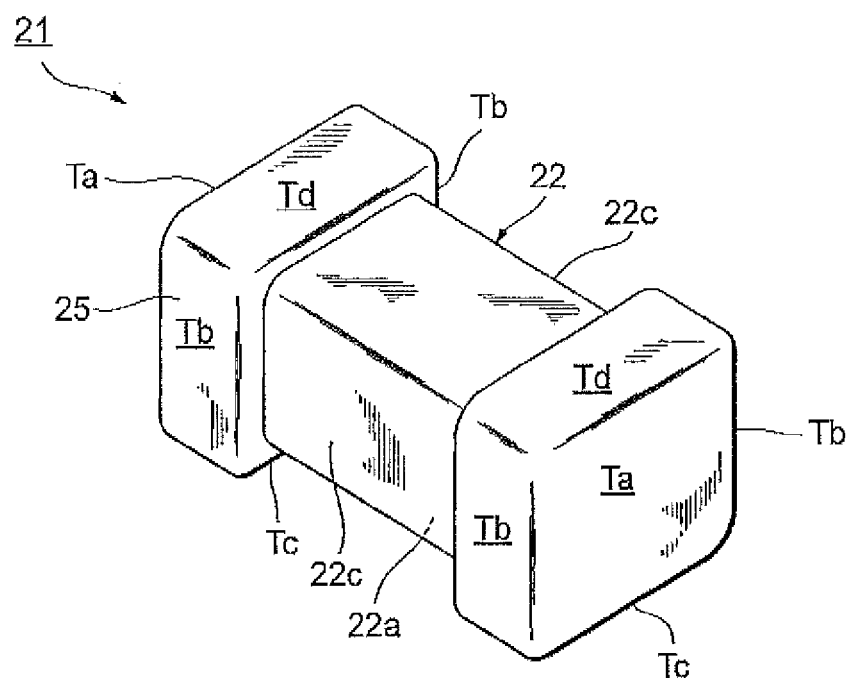
FIG. 5 is a perspective view of the electronic component of Embodiment 1.

The third step is a step of providing the surfaces of the terminal electrodes 25 with the oxide films 26, i.e., a step of partly covering the terminal electrodes 25 with the oxide films 26. FIG. 5 is a perspective view of the electronic component 29 of Embodiment 1. Referring to the surfaces of the side face parts 25b (opposing each other in the longitudinal direction) of the terminal electrodes 25 parallel to the side faces 22b of the element body 22 of the electronic component 21 as Ta, the surfaces (opposing each other in the lateral direction) excluding the surfaces Ta of the side face parts 25b in the surfaces abutting the surfaces of the mounting parts 25a as Tb, the surfaces to be mounted on the board as Tc, and the surfaces on the opposite side of the surfaces Tc as Td, the surfaces to be provided with the oxide films 26 will be explained.

It is sufficient for the surfaces Tc to exist on one identical surface of the electronic component 29 and for at least the surfaces Ta of the terminal electrodes 25 to be covered with the oxide films 26. This longitudinally reduces the mounting area of the electronic component 29, thereby enabling high-density mounting. Preferably, the surfaces Ta, Tb of the side face parts 25b of the terminal electrodes 25 are covered with the oxide films 26. This can inhibit solder from rising at the time of mounting, thereby laterally reducing the mounting area of the electronic component 29. In Embodiment 1, as illustrated in FIG. 3, the surfaces Ta, Tb, Td of the terminal electrodes 25 are covered with the oxide films 26.

The method of providing the surfaces of the terminal electrodes 25 with the oxide films 26 is not limited in the third step. For example, sputtering with oxide targets and direct coating with paste and the like containing oxides may be used.

A method of oxidizing the surfaces of the terminal electrodes 25 may also be used. The method of oxidization is not limited in particular and may be performed by heating in the air or an atmosphere with a high oxygen concentration or chemically processing the surfaces. For example, heat treatment in the air for 2 to 7 hr at a temperature of 200° C. or higher can form the oxide films 26.

The fourth step is a step of joining the electronic component 29 obtained by the third step to the connection pads 30P on the board 30 with the solder 30F, so as to yield the electronic circuit module component. As the solder at this time, any commercially available solder may be used without restrictions in particular. For example, Sn—Pb solder or lead-free solder may be used. As the lead-free solder, Sn-3.5 mass % Ag, Sn-3.0 mass % Ag-0.5 mass % Cu, Sn-0.7 mass % Cu, or the like may be selected according to the use, for example.

Figure 6:
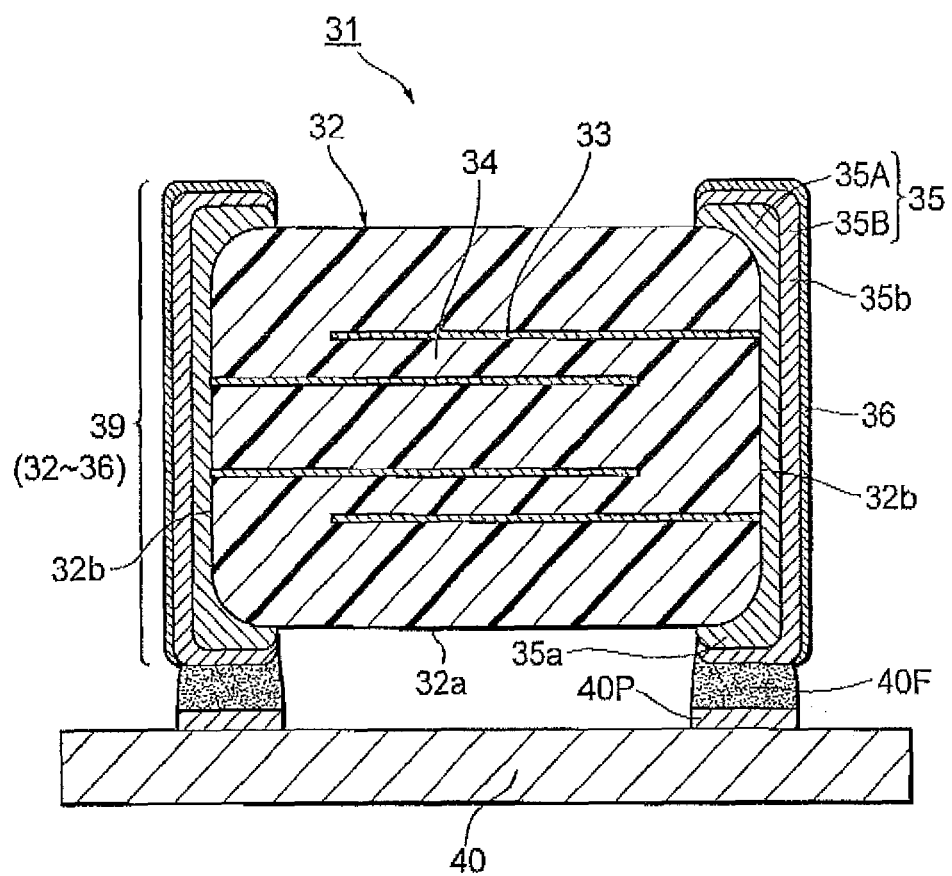
FIG. 6 is a sectional view schematically illustrating the electronic circuit module component of Embodiment 2.

FIG. 6 is a schematic view illustrating a cross section of an electronic circuit module component 31 of Embodiment 2 in accordance with the present invention. An electronic component 39 of the electronic circuit module component 31 is connected to connection pads 40P on a board 40 with solder 40F. A terminal electrode 35 of the electronic component 39 differs from the terminal electrode 25 of Embodiment 1 in that it is constituted by two layers 35A, 35B. That is, the terminal electrode 35 of Embodiment 2 comprises a foundation electrode layer 35A which is similar to the terminal electrode 25 of Embodiment 1 and formed on a mounting surface 32a and side face 32b of an element body 32, and a surface layer 35B formed on a surface of the foundation electrode layer 35A, while an oxide film 36 is formed on a surface of the terminal electrode 35. As illustrated in FIG. 6, surfaces of side face parts 35b of the terminal electrodes 35 in the electronic component 39 are covered with oxide films 36. Here, though not restricted in particular, the surface layers 35B may be mainly composed of elements such as Cu and Ni. From the viewpoint of partly oxidizing the surface layers 35B, so as to produce the oxide films 36, Cu and Ni are used preferably.

For providing the surfaces of the terminal electrodes 35 with the oxide films 36, producing the oxide films 36 by oxidizing the surface layers 35B of the terminal electrodes 35 as in Embodiment 2 is more preferred in that it can stably secure the conduction of the terminal electrodes 35.

Though the method of forming the surface layers 35B at this time is not restricted in particular, a fifth step is provided as (v) a step of forming the surface layers 35B after the second step (ii). For example, sputtering, vapor deposition, or plating may be used as the fifth step at this time.

From the viewpoint of inhibiting the foundation electrode layers 35A of the terminal electrodes 35 from dissolving into solder when mounting the electronic component 39 onto the board 40 with the solder in the case where the foundation electrode layers 35A of the terminal electrodes 35 are constituted by a composition containing Cu, the surface layers 35B at this time are more preferably provided as layers of a composition containing Ni or a Ni alloy. The Ni or Ni alloy layers are preferably formed by plating or vapor deposition. Their thickness, which may be determined as appropriate according to their uses and the like, is preferably on the order of 0.5 to 10 µm in general.

Figure 7:
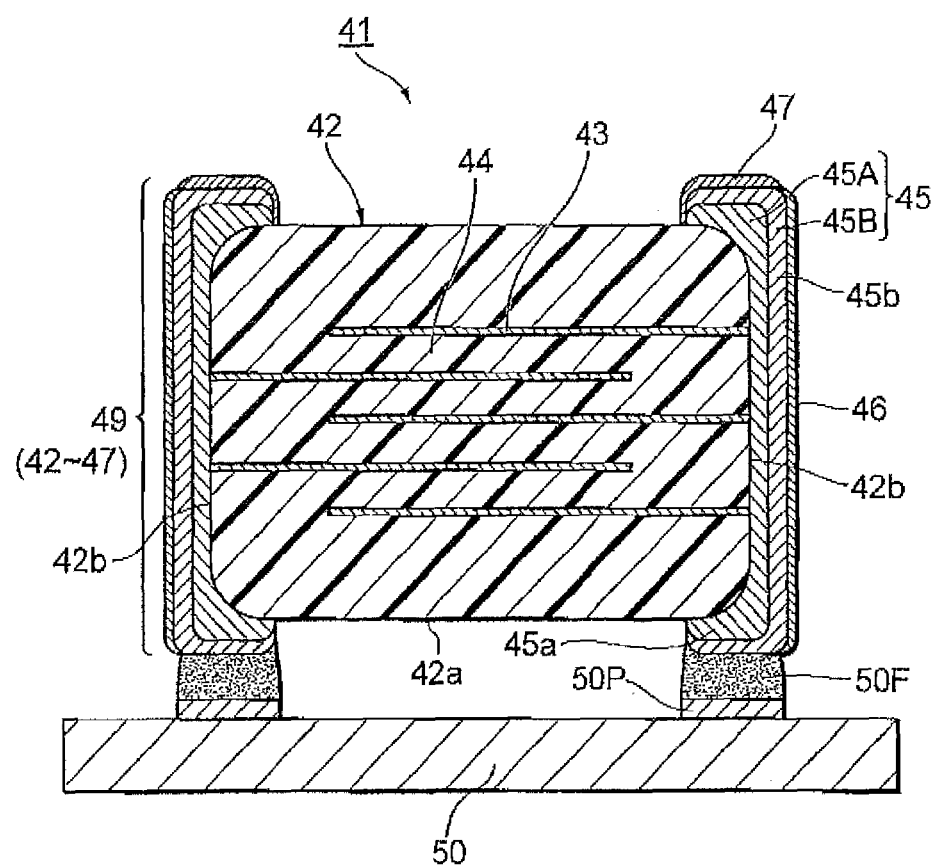
FIG. 7 is a sectional view schematically illustrating the electronic circuit module component of Embodiment 3.

FIG. 7 is a schematic view illustrating a cross section of an electronic component 49 of Embodiment 3 in accordance with the present invention. It is the same as the multilayer ceramic electronic component 39 of Embodiment 2 except that metal layers 47 are provided as the metal layers. That is, a terminal electrode 45 of the electronic component 49 comprises a foundation electrode layer 45A which is similar to the terminal electrode 25 of Embodiment 1 and formed on a mounting surface 42a and side faces 42b of an element body 42 and a surface layer 45B formed on a surface of the foundation electrode layer 45A, while an oxide film 46 and the metal layer 47 are formed on a surface of the terminal electrode 45.

Though the method of forming the metal layers 47 at this time is not restricted in particular, a sixth step is provided as (vi) a step of forming the first and second terminal electrodes 45 with the metal layers 47 adapted to produce an alloy with solder after the second step before the fourth step. Here, the metal layers 47 are preferably Sn or Sn alloy layers from the viewpoint of connectivity with solder. Preferably, the terminal electrodes 45 are formed with the Sn or Sn alloy layers by plating or molten soldering.

The order of performing the third step of forming the oxide films and the sixth step of forming the metal layers is not restricted in particular, so that they may be done in the reverse order. In the latter case, the sixth step forms the metal layers, and then, while masking the metal layers, the third step is performed, so as to provide the surfaces of the terminal electrodes with the oxide films.

The metal layers 47 are disposed on only the surfaces Tc and Td, which are surfaces to be mounted on a board, while the other surfaces Ta, Tb of the terminal electrodes 45 are covered with the oxide films 46. This can choose two mounting surfaces onto the board, thereby lowering the process load at the time of mounting.

Thus manufactured electronic circuit module components in accordance with Embodiments 1 to 3 of the present invention can be used for various electronic instruments and the like.

EXAMPLES

The embodiments of the present invention will now be explained in detail according to examples with reference to the drawings.

Example 1

First, an element body in the form of 0.4 mm×0.2 mm×0.2 mm (0402M) was prepared, and its end faces were coated with a Cu paste for external electrodes, which was then fired, so as to form a pair of terminal electrodes. The external electrodes were fired for 10 min at a temperature of 700° C. in a humidified mixed gas of $N_2$ and $H_2$.

Thus obtained element body was masked such as to cover all the surfaces of the mounting parts of the pair of terminal electrodes and put into a hot-air dryer, so as to be heat-treated in the air, whereby the surfaces of the terminal electrodes excluding the masked surfaces were oxidized, thus forming the oxide films.

Thus obtained element body was washed with alcohol and dipped for 10 min in a thiourea-doped Sn plating solution (at a bath temperature of 70° C.), so as to form a Sn electroless plating film having a thickness of 1 μm as a metal layer on the surfaces of the terminal electrodes excluding the oxide films, thereby yielding an electronic component.

The terminal electrodes of thus obtained electronic component were mounted to connection pads of a board, so as to yield a sample of Example 1. Thus obtained was the sample of Example 1 in which, as in Embodiment 1, the surfaces of the mounting parts of the terminal electrodes of the electronic component were joined to the connection pads on the board with solder, while the remaining parts were covered with oxide films.

The sample was evaluated by using techniques which will be explained later.

Evaluation of Spread of Solder at the Joint Between the Terminal Electrode of the Electronic Component and the Board in the Printed Wiring Board For assessing the mounting area of thus obtained electronic circuit module component, the spread of solder at the joint between the terminal electrode of the electronic component and the board in the printed wiring board was evaluated. The method of evaluation will be explained with reference to FIG. 4.

A solder spread evaluation board 30 formed with connection pads 30F for mounting an electronic component having a form of 0.4 mm×0.2 mm (0402M) was prepared. Solder paste was printed on the connection pads 30P of the solder spread evaluation board 30. Using a mounter, each of electronic components 29 of 0402M produced by examples and comparative examples was placed on the solder spread evaluation board 30. The solder spread evaluation board 30 mounted with the electronic component 29 was heated in a reflow furnace, so as to join the terminal electrode 25 of the electronic component 29 to the connection pad 30P of the board, thereby yielding an electronic circuit module component sample for solder spread evaluation. Using thus obtained solder spread evaluation sample, the solder spread was evaluated.

Molten solder having higher wettability with respect to the terminal electrode 25 is easier to spread over surfaces of the terminal electrode 25 of the electronic component 29. Therefore, the solder spreads widely, so as to increase the mounting area on the board 30, while wetting the surfaces of the electronic component 29 adjacent to other electronic components, thereby raising the possibility of short-circuiting.

The spread of molten solder was evaluated by comparing L1 and L2 with each other in the direction of a pair of terminal electrodes 25 in the electronic component 29, where L1 is the thickness (of the oxide film 26) from the surface of the oxide film 26 to a boundary between the surface of the side face part 25b of the terminal electrode 25 of the electronic component 29 and the oxide film 26 when the terminal electrode 25 of the electronic component 29 is joined to the connection pad 30P of the solder spread evaluation board 30 with the solder, and L2 is the distance from the surface of the oxide film 26 to a boundary between the oxide film 26 and the solder joint as seen as a thickness in a direction perpendicular to the mounting surface of the electronic component 29. In the solder spread evaluation, L1 and L2 were measured by observing a cross section. When the terminal electrode 25 has a surface layer at the side face part 25b, the thickness to a boundary between the surface layer and the oxide film was taken as L1. While this boundary can be seen with an analyzer equipped with a composition analyzing function, a metallographic microscope was used here, so as to perform identification and measurement on its observation surface according to a difference in reflectance.

Figure 4:
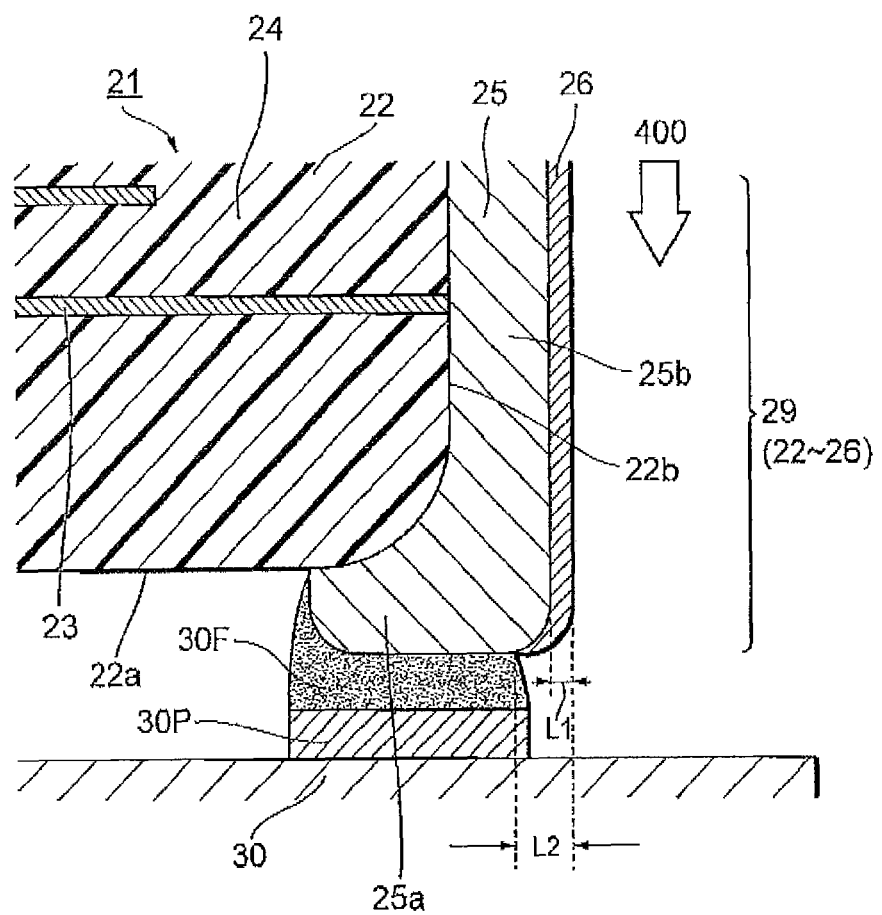
FIG. 4 is an enlarged view of a joint between an electronic component and a board in the electronic circuit module component of Embodiment 1 serving as an explanatory view for evaluating the positional relationship between the joint and a terminal electrode part.

The solder spread L2 is measured in a cross section in the longitudinal direction of the electronic component 29 (in the direction of the terminal electrode 25 of the electronic component 29) in FIG. 4. When the solder was seen to spread in a direction other than the longitudinal direction of the terminal electrode 25, however, it was measured by observing a cross section in the spreading direction.

As the solder used here, commercially available solder may be employed, while the heating condition in the reflow furnace may be adjusted according to the solder. Here, using lead-free solder having a composition of 96.5 wt % of Sn, 3 wt % of Ag, and 0.5 wt % of Cu (manufactured under the product name of M705 by Senju Metal Industry Co., Ltd.), heating in the reflow furnace was performed under such a condition that a temperature of 240° C. or higher was kept for 30 s with a top temperature of 260° C.

Short-Circuit Evaluation

For assessing the reliability in mounting thus obtained electronic circuit module component, evaluated was an electronic circuit module component produced by mounting two obtained electronic circuit module components at an interval of 0.06 mm in the direction in which the side face parts of the terminal electrodes were adjacent to each other in mounting areas when mounted on the board. Here, 10 such electronic circuit module components were prepared, those producing no short circuits were labeled "A" as favorable, and those producing short circuits were labeled "B" as poor. Those which could not be mounted were labeled "C" as unevaluable.

Next, in an element body obtained by forming a Ni coating layer as a surface layer by electrolytic plating, surfaces of a pair of terminal electrodes excluding surfaces of mounting parts of the terminal electrodes were oxidized, so as to form oxide films. Thereafter, a Sn electroless plating film having a thickness of 1 μm was formed as a metal layer on the Ni skin layer on the surface layer other than the oxide films, so as to yield a sample of Example 2. That is, a sample similar to Embodiment 2 was obtained.

Table 1 illustrates evaluation results of the samples of Examples 1 and 2. Table 1 indicates the positions of metal layers and oxide films on the terminal electrode surfaces of the electronic components in the same positional explanations as with the surface positions illustrated in the perspective view of the electronic component of Embodiment 1. Further, in the surfaces of the terminal electrodes, those provided with the oxide films and metal layers are labeled as Oxide and Metal, respectively.

TABLE 1

| Condition | Surface layer element | Oxide film element | Surface formed with oxide film in terminal electrode | | | Evaluation item | |
|---|---|---|---|---|---|---|---|
| | | | Surface Ta | Surface Tb | Surface Td | Solder spread | Short circuit |
| Example 1 | no surface layer | Cu | Oxide | Oxide | Oxide | L1 < L2 | A |
| Example 2 | Ni | Ni | Oxide | Oxide | Oxide | L1 < L2 | A |

The following results could be seen from Table 1. In these examples, the samples were evaluated with regard to whether or not the terminal electrodes of the electronic components had the surface layers. Each of the samples represented as Examples 1 and 2 was seen to have oxidized the surfaces Ta, Tb of the terminal electrodes and exhibited a solder spread smaller than the length of the electronic component in the longitudinal direction, thereby yielding favorable structures with small mounting areas as the terminal electrodes, thus achieving higher density in electronic circuit module components.

Examples 2 to 4 and Comparative Examples 1 and 2

Samples of Examples 3 and 4 and Comparative Examples 1 and 2 were made as with Example 2 except that surfaces to be provided with oxide films in the terminal electrode electrodes were changed from Example 2 as illustrated in Table 2. Results are also listed in Table 2. The sample of Example 3 was the same as the electronic component 39 of Example 2 (Embodiment 2) except for the positions where the metal layers were disposed. That is, a sample similar to Embodiment 3 was obtained.

TABLE 2

| Condition | Oxide film element | Surface formed with oxide film in terminal electrode | | | Evaluation item | |
|---|---|---|---|---|---|---|
| | | Surface Ta | Surface Tb | Surface Td | Solder spread | Short circuit |
| Example 2 | Ni | Oxide | Oxide | Oxide | L1 < L2 | A |
| Example 3 | Ni | Oxide | Oxide | Metal | L1 < L2 | A |
| Comparative Example 1 | Ni | Metal | Oxide | Metal | L1 > L2 | B |
| Example 4 | Ni | Oxide | Metal | Metal | L1 > L2 | A |
| Comparative Example 2 | Ni | Metal | Metal | Metal | L1 > L2 | B |

The following results could be seen from Table 2. In these examples, the samples were evaluated with regard to differences in oxidized surfaces of terminal electrodes in the electronic components. The samples represented as Examples 2 and 3 were seen to have oxidized the surfaces Ta, Tb of the terminal electrodes and caused no solder to spread over the surfaces Ta, Tb, thereby yielding favorable structures with small mounting areas as the terminal electrodes, thus achieving higher density in electronic circuit module components.

The sample represented as Example 4 oxidized the surfaces Ta of the terminal electrodes and thus did not cause solder to spread over the surfaces Ta but Tb. Therefore, it could achieve higher density in directions of the surfaces Ta, but the mounting area on the solder joint was greater than in Example 2. On the other hand, since the surfaces Ta of the terminal electrodes were oxidized, no short circuits occurred.

In the samples represented as Comparative Examples 1 and 2, on the other hand, the surfaces Ta of the terminal electrodes were not oxidized, whereby solder spreads occurred. Short circuits also occurred upon high density mounting.

Example 5 and Comparative Example 3

Samples of Example 5 and Comparative Example 3 were made as with Example 2 except that the kinds of metals contained in the oxide films of the terminal electrodes were changed from Example 2. Table 3 illustrates the results.

TABLE 3

| Condition | Oxide film element | Surface formed with oxide film in terminal electrode | | | Evaluation item | |
|---|---|---|---|---|---|---|
| | | Surface Ta | Surface Tb | Surface Td | Solder spread | Short circuit |
| Example 2 | Ni | Oxide | Oxide | Oxide | L1 < L2 | A |
| Example 5 | Cu | Oxide | Oxide | Oxide | L1 < L2 | A |
| Comparative Example 3 | Sn | Oxide | Oxide | Oxide | L1 > L2 | B |

The following results could be seen from Table 3. In these examples, the samples were evaluated with regard to differences in kinds of metals contained in the oxide films of the terminal electrodes of the electronic components. Examples 2 and 5 oxidized the surfaces Ta, Tb of the terminal electrodes and caused no solder to spread over the surfaces Ta, Tb, thereby yielding favorable structures with small mounting areas as the terminal electrodes, thus achieving higher density in electronic circuit module components.

On the other hand, the sample represented as Comparative Example 3 covered the surfaces Ta, Tb with oxide films as with Examples 2 and 5. However, solder wets the oxidized Sn film though more slowly than the metallic Sn film and thus spreads over the surfaces Ta, Tb. Hence, the terminal electrodes with small mounting areas could not be obtained, whereby higher density could not be achieved in electronic circuit module components.

Comparative Examples 5 and 6

Samples of Comparative Examples 5 and 6 were made as with Example 2 except that the kinds of metals contained in the oxide films of the terminal electrodes were changed and that the terminal electrodes were oxidized in order to provide all the surfaces of the terminal electrodes with the oxide films, No Sn layer was formed in the sample of Comparative Example 6, since its surface layer contained Sn. Table 4 illustrates the results.

TABLE 4

| Condition | Metal film element | Surface formed with oxide film in terminal electrode | | | Evaluation item | |
|---|---|---|---|---|---|---|
| | | Surface Ta | Surface Tb | Surface Td | Solder spread | Short circuit |
| Example 2 | Ni | Oxide | Oxide | Oxide | L1 < L2 | A |
| Comparative Example 4 | Sn | Oxide | Oxide | Oxide | L1 > L2 | B |

The following results could be seen from Table 4. Evaluated in these examples were samples in which, while changing the kinds of metals contained in the oxidized films of the terminal electrodes of the electronic components, all the surfaces of the terminal electrodes were oxidized. The sample represented as Comparative Example 4 caused solder to spread over the surfaces Ta, Tb, thereby yielding a short circuit when mounted at high density. This failed to yield terminal electrodes with small mounting areas, whereby higher density could not be achieved as an electronic circuit module component.

Example 6

A sample was made as with Example 2 except that oxide films were formed on surfaces other than those of the mounting parts by using a NiO target without oxidizing any of the surfaces of the terminal electrodes. Table 5 illustrates the results.

TABLE 5

| Condition | Metal film element | Surface formed with oxide film in terminal electrode | | | Evaluation item | |
|---|---|---|---|---|---|---|
| | | Surface Ta | Surface Tb | Surface Td | Solder spread | Short circuit |
| Example 6 | Ni | sputtering | sputtering | sputtering | L1 < L2 | A |

The following results could be seen from Table 5. This example evaluated a sample in which oxide films were formed on surfaces other than those of the mounting parts by using the NiO target without oxidizing the terminal electrodes of the electronic component. The sample represented in Example 6 was favorable in each of the evaluation results and yielded favorable structures with small mounting areas as the terminal electrodes, whereby higher density could be achieved in an electronic circuit module component.

Electronic circuit module components in which the electronic components obtained by Examples 1 to 6 were mounted with narrower longitudinal intervals therebetween incurred no troubles such as short circuits between the electronic components and thus could be mounted at high density.

Without being restricted at all to the embodiments explained in the foregoing, the present invention can be modified in various ways within the scope not deviating from the gist of the invention.

For example, though the above-mentioned embodiments illustrate multilayer ceramic capacitors as an example of the electronic component in the electronic circuit module component in accordance with the present invention, its examples include capacitors, piezoelectric elements, inductors, varistors, thermistors, resistors, transistors, diodes, crystal oscillators, their composite elements, and other surface-mounting chip type electronic components.

INDUSTRIAL APPLICABILITY

The present invention can provide an electronic circuit module component having an electronic component with smaller mounting area at high density and thus can be utilized for mounting to electronic instruments requiring higher density.

What is claimed is:

1. An electronic circuit module component comprising:
an electronic component comprising an element body; and
a board joined to the electronic component with solder,
the element body comprising:
   a first end surface and a second end face at two opposite ends, respectively, in a direction of the electronic component, the direction being parallel with the board;
   a mounting surface that opposes the board and connects the first end face and the second end face;
   an top surface that is on an opposite side of the mounting surface and connects the first end face and the second end face; and
   a first lateral face and a second lateral face substantially parallel with each other and each connecting the mounting surface, the top surface, the first end face and the second end face, and
the electronic component comprising:
   a first terminal electrode having a first end part formed on the first end face, a first part formed on a portion of the first lateral face and a portion of the second lateral face that are adjacent to the first end face, and a first mounting part formed on a portion of the mounting surface that is adjacent to the first end face,
   a second terminal electrode having a second end part formed on the second end face, a second side part formed on a portion of the first lateral face and a portion of the second lateral face that are adjacent to the second end face, second end face, and a second mounting part formed on a portion of the mounting surface that is adjacent to the second end face; and
   an oxide film covering the entire surface of the first end part and the entire surface of the first side part, the oxide film being obtained by oxidizing surfaces of the first and second terminal electrodes;
wherein the first mounting part and the second mounting part are joined to the board with the solder.

2. An electronic circuit module component according to claim 1, wherein L1<L2, where L1 is a thickness of the oxide film at the first end part or the second end part, and L2 is a distance, as seen in a direction perpendicular to the mounting surface, from an outer surface of the oxide film at the first end part or the second end part to a boundary between the solder adjacent to the first end part or the second end part and the oxide film at the first end part or the second end part.

3. An electronic circuit module component according to claim 1, wherein the oxidizing is forced oxidizing.

4. An electronic circuit module component according to claim 1, wherein:
the first terminal electrode and second terminal electrode each has a top part formed on the top surface; and
a metal layer is formed on the top part of the first terminal electrode and the second terminal electrode.

5. An electric circuit module component according to claim 1, further comprising another oxide film covering the entire surface of the second end part and the entire surface of the second side part.

6. An electronic circuit module component comprising:
an electronic component comprising an element body; and
a board joined to the electronic component with solder,
the element body comprising:
   a first end surface and a second end face at two opposite ends, respectively, in a direction of the electronic component, the direction being parallel with the board;
   a mounting surface that opposes the board and connects the first end face and the second end face;
   an top surface that is on an opposite side of the mounting surface and connects the first end face and the second end face; and
   a first lateral face and a second lateral face substantially parallel with each other and each connecting the mounting surface, the top surface, the first end face and the second end face, and
the electronic component comprising:
   a first terminal electrode having a first end formed on the first end face, a first side part formed on a portion of the first lateral face and a portion of the second lateral face that are adjacent to the first end face, and a first mounting part formed on a portion of the mounting surface that is adjacent to the first end face, and
   a second terminal electrode having a second end part formed on the second end face, a second side part formed on a portion of the first lateral face and a portion of the second lateral face that are adjacent to the second end face, second end face, and a second mounting part formed on a portion of the mounting surface that is adjacent to the second end face; and
   an oxide film covering the entire surface of the first end part, the entire surface of the second end part, the entire surface of the first side part, and the entire surface of the second side part, the oxide film including a metal that is a same metal contained in the surface of the side face part,
wherein the first mounting part and the second mounting part are joined to the board with the solder.

7. An electronic circuit module component according to claim 5, wherein L<L2, where L1 is a thickness of the oxide film at the first end part or the second end part, and L2 is a distance, as seen in a direction perpendicular to the mounting surface, from an outer surface of the oxide film at the first end part or the second end part to a boundary between the solder adjacent to the first end part or the second end part and the oxide film at the first end part or the second end part.

8. An electronic circuit module component according to claim 6, wherein:
the first terminal electrode and second terminal electrode each has a top part formed on the top surface; and
a metal layer is formed on the top part of the first terminal electrode and the second terminal electrode.

9. An electric circuit module component according to claim 6, further comprising another oxide film covering the entire surface of the second end part and the entire surface of the second side part.

* * * * *